US006906452B2

(12) United States Patent
Ichikawa

(10) Patent No.: US 6,906,452 B2
(45) Date of Patent: Jun. 14, 2005

(54) ELECTROLUMINESCENT DISPLAY DEVICE WITH SUBSTRATE HAVING REGIONS WITH DIFFERENT REFRACTIVE INDEXES

(75) Inventor: Nobuhiko Ichikawa, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 134 days.

(21) Appl. No.: 10/394,652

(22) Filed: Mar. 24, 2003

(65) Prior Publication Data

US 2004/0080264 A1 Apr. 29, 2004

(30) Foreign Application Priority Data

Mar. 26, 2002 (JP) .......................... 2002-084933

(51) Int. Cl.⁷ .............................. H01J 5/16; H01J 1/62
(52) U.S. Cl. ....................................... 313/110; 313/512
(58) Field of Search ............................ 313/505, 506, 313/512, 110, 112, 117

(56) References Cited

U.S. PATENT DOCUMENTS

| | | | | | |
|---|---|---|---|---|---|
| 4,670,690 A | * | 6/1987 | Ketchpel | .................... | 313/505 |
| 4,810,931 A | * | 3/1989 | McKenna et al. | .......... | 313/509 |
| 5,557,295 A | * | 9/1996 | Miyashita et al. | ............ | 345/36 |
| 5,745,199 A | * | 4/1998 | Suzuki et al. | .................. | 349/95 |
| 6,069,443 A | * | 5/2000 | Jones et al. | .................. | 313/504 |
| 6,075,317 A | * | 6/2000 | Keyser et al. | .................. | 313/505 |
| 6,091,384 A | * | 7/2000 | Kubota et al. | ................. | 345/76 |
| 6,166,489 A | * | 12/2000 | Thompson et al. | ......... | 313/506 |
| 6,198,220 B1 | * | 3/2001 | Jones et al. | .................. | 313/512 |
| 6,414,439 B1 | * | 7/2002 | Tuenge et al. | ........... | 315/169.1 |

* cited by examiner

Primary Examiner—Vip Patel
Assistant Examiner—Anthony Perry
(74) Attorney, Agent, or Firm—Parkhurst & Wendel, L.L.P.

(57) ABSTRACT

The present invention provides an electroluminescent display which can efficiently radiate light emitted from an electroluminescent layer to a viewer side and, at the same time, can reduce a deterioration in contrast of a displayed image caused by external light. The electroluminescent display includes a light transparent substrate and an electroluminescent layer provided on the light-transparent substrate. The electroluminescent layer includes at least a transparent electrode, an organic luminescent layer, and a cathode. Two or more regions with different refractive indexes are provided within said light-transparent substrate.

9 Claims, 3 Drawing Sheets

PRIOR ART

ELECTROLUMINESCENT DISPLAY DEVICE WITH SUBSTRATE HAVING REGIONS WITH DIFFERENT REFRACTIVE INDEXES

TECHNICAL FIELD

The present invention relates to an organic electroluminescent display including an organic electroluminescent device as a luminescent source. More particularly, the present invention relates to an electroluminescent display which can improve the efficiency of taking out light, emitted from an electroluminescent device, to the outside of the electroluminescent display (light take-out efficiency) and, at the same time, can suppress a deterioration in contrast of a displayed image caused by external light reflection.

BACKGROUND ART

Electroluminescent devices have features including wide angle of visibility by virtue of selfluminous nature and lower power consumption. Because of these features, up to now, various inorganic electroluminescent devices using inorganic compounds as luminescent materials and various organic electroluminescent devices using organic compounds as luminescent materials (these organic compounds will be hereinafter referred to as "organic luminescent materials") have been proposed, and an attempt has been made to put the electroluminescent devices into practical use.

Among others, organic electroluminescent devices can significantly reduce necessary application voltage, as compared with inorganic electroluminescent devices. This has led to active studies on the development of organic electroluminescent devices having higher performance through the development of and an improvement in materials for the organic electroluminescent devices. Studies on the utilization of organic electroluminescent devices as a surface light source has been put forward. At the same time, the development of organic electroluminescent devices capable of emitting various colors has led to studies on the utilization of organic electroluminescent devices as pixels of displays. In a display using organic electroluminescent devices as pixels, a plurality of organic electroluminescent devices are two-dimensionally arranged on an identical plane to form a panel (a display panel), and these devices are driven independently of each other or one another to display a desired image.

FIG. 1 is a schematic diagram illustrating a basic construction of an organic electroluminescent display. As shown in FIG. 1, the organic electroluminescent display includes a light transparent substrate 1 and, stacked on the substrate 1 in the following order, a transparent anode 2, an organic luminescent layer (hereinafter simply referred to as "luminescent layer") 3, and a cathode 4. A display comprising the transparent anode 2, the luminescent layer 3, and the cathode 4 stacked in that order on a specific substrate 1 is an organic electroluminescent display referred to in the present invention. The position of the anode and the position of the cathode are sometimes reversed. Further, in order to improve the performance, the interposition of a hole transport layer between the anode and the luminescent layer, the interposition of an electron injection layer between the cathode and the luminescent layer, or the interposition of an adhesive layer between the cathode and the luminescent layer or between the electron injection layer and the luminescent layer is sometimes adopted. The luminescent layer is generally formed of one or a plurality of organic luminescent materials. In some cases, however, the luminescent layer is formed of, for example, a mixture composed of an organic luminescent material and a hole transport material and/or an electron injection material.

Further, in the organic electroluminescent display, in general, a surface in a substantially parallel positional relationship with the main surface of the luminescent layer serves as a light outgoing surface, and, in the pair of electrodes (anode and cathode) constituting the organic electroluminescent device, the electrode (=anode) located on the light outgoing surface side is formed of a transparent or translucent thin film (hereinafter often referred to as "transparent electrode") for light take-out efficiency improvement purposes or for reasons of construction of a surface emitting device. On the other hand, the electrode (=cathode) located opposite to the light outgoing surface is formed of a specific metallic thin film (a thin film of a metal, an alloy, a mixed metal or the like).

The above organic electroluminescent display also involves several problems to be solved. One of the problems is low effective light take-out efficiency. Even in the case of an organic luminescent material which exhibits a considerably high internal quantum efficiency in the luminescence, since the refractive index of the substrate is high, the critical angle at which the light emitted from the electroluminescent layer can be radiated to the outside of the electroluminescent display is small. Therefore, as shown in FIG. 1, a considerably large proportion of light emitted from the electroluminescent layer cannot be radiated from within the substrate to the outside of the electroluminescent display and is propagated in the facial direction while undergoing multiple reflection before radiation to the outside of the electroluminescent display. Further, in many cases, the wavelength of light emitted from the electroluminescent layer is likely to be absorbed in the substrate. Therefore, multiple reflection of the light within the substrate is disadvantageous from the viewpoint of the utilization of luminescence and thus has become a serious problem. The light take-out efficiency of the organic electroluminescent display is generally as low as about 20%.

In order to improve the light take-out efficiency, the provision of a lower refractive index layer on the electroluminescent layer in its light outgoing side has also been proposed, for example, in Advanced Materials 2001, 13, No. 15, August, P. 1149–1152, "Doubling Coupling-Out Efficiency in Organic Light-Emitting Devices Using a Thin Silica Aerogel Layer." The claimed advantage of this construction is as follows. Light emitted from the luminescent layer is first radiated to the lower refractive index layer having a refractive index substantially equal to the refractive index of an air layer. By virtue of this, even after subsequent passage through a higher refractive index layer, total reflection does not take place, and, theoretically, the light can be entirely radiated to the air layer on the viewer side. In the above technique, a silica aerogel having a refractive index n of 1.01 to 1.10 is provided between the luminescent layer and the substrate, and the whole light emitted from the electroluminescent layer except for a single mode light constituting a part of the light emitted from the electroluminescent layer which is propagated through the electroluminescent layer, once enters the lower refractive index layer. Therefore, the occurrence of the total reflection in a subsequent stage at the interface between the higher refractive index layer and the lower refractive index layer can be prevented. The use of the silica aerogel, however, necessitates the provision of the step of dipping in water. Since water is a vital unfavorable factor in the organic electroluminescent layer which shortens the service life of the device, when commercialization is taken into consideration, the adoption of this technique using silica aerogel is difficult.

Further, Japanese Patent Laid-Open No. 74072/1999 discloses a method wherein a micro lens array is formed on a substrate to enhance light take-out efficiency. Even in this method, however, sealing of an insulating liquid having a lower refractive index into between a luminescent layer and a lens array poses problems of service life of an electroluminescent display, a complicate process and the like.

Japanese Patent Laid-Open No. 283751/1999 (Japanese Patent No. 2991183) discloses a method wherein the direction of advance of light, which has been radiated from the electroluminescent layer and causes total reflection, is deviated by a diffraction grating from the total reflection angle to improve light take-out efficiency. In this method, however, since wavelength dispersion occurs, particularly for short-wavelength display colors in a full-color display, a diffraction angle necessary for deviating the direction of advance of the light from the total reflection angle cannot be sometimes provided. Further, the dispersion of light caused by diffraction is likely to cause color blurring.

Japanese Patent Laid-Open No. 260559/2000 discloses a method wherein an assembly of optical fibers made of quartz glass or a polymer is cut into thin pieces to prepare a substrate, the whole cut surface thereof is covered with an organic material or an inorganic material, the surface roughness thereof is finished into 300 nm or less, and pixels are formed thereon. The claimed advantage of this device is that luminescence is incident to the inside of each fiber of the group of optical fibers, is then easily transmitted while being confined in each fiber by total reflection, and can be efficiently taken out, as transmitted light, to the outside of the system.

In the light propagated in this way, however, the angle of light outgoing surface to a normal is originally less than the total reflection angle. Therefore, in this method, to begin with, light rays in the total reflection region are leaked without being guided through the group of fibers. In the above publication, there is also a description on the use of tapered fibers. The intention of using the tapered fibers, however, is merely to perform magnified display of the pixels. Further, in the preparation of the substrate, bundling of a fiber array is carried out, and the bundle is then sliced to prepare the substrate. Therefore, difficulties are encountered in the preparation of the substrate.

Another problem involved in the organic electroluminescent device is a deterioration in visibility and contrast of a displayed image derived from external light. The deteriorated visibility and contrast of the displayed image are attributable to such a phenomenon that a large part of light introduced into the device from the outside thereof is reflected from a cathode formed of a metallic thin film, which reflects about 70% of visible light, and is radiated from the light outgoing surface of the device. A conventional method for solving this problem is to adopt such a construction that a polarizing plate and a quarter-wavelength plate are disposed in the front of an electroluminescent layer. In this construction, external light is first attenuated by the polarizing plate to not more than ½ and is further converted to a circularly polarized light by the quarter-wavelength plate. The circularly polarized light is converted by an electrode to a circularly polarized light in the opposite direction which is again converted by the quarter-wavelength plate to a linearly polarized light in a direction orthogonal to the incident light. The linearly polarized light is substantially entirely absorbed in the polarizing plate. In this method, however, disadvantageously, luminescence per se is also attenuated to about ½. Therefore, the efficiency of the display is sacrificed.

DISCLOSURE OF THE INVENTION

An object of the present invention is to provide an electroluminescent display which can efficiently radiate light emitted from an electroluminescent layer to a viewer side and, at the same time, can reduce a deterioration in contrast of a displayed image caused by external light.

The above object can be attained by an electroluminescent display comprising: a light transparent substrate; and an electroluminescent layer provided on said light transparent substrate, said electroluminescent layer comprising at least a transparent electrode, an organic luminescent layer, and a cathode, wherein two or more regions with different refractive indexes are provided within said light-transparent substrate.

BEST MODE FOR CARRYING OUT THE INVENTION

Figure 1:
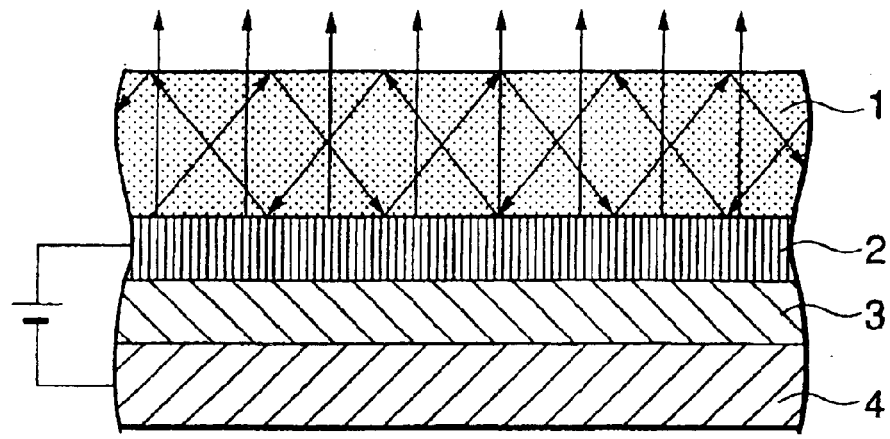
FIG. 1 is an explanatory view of a basic construction of a conventional electroluminescent display.
Figure 2:
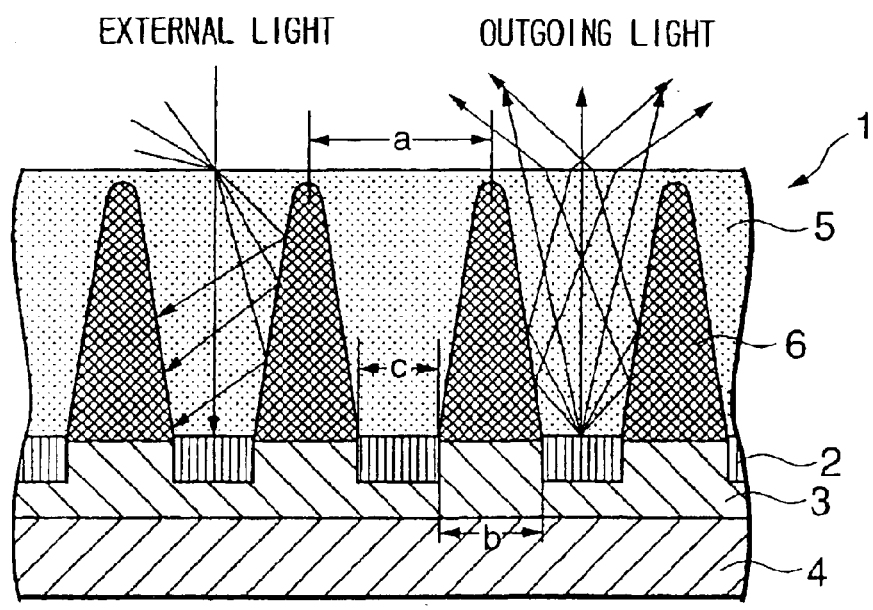
FIG. 2 is a cross-sectional view of one embodiment of the electroluminescent display according to the present invention.
Figure 3:
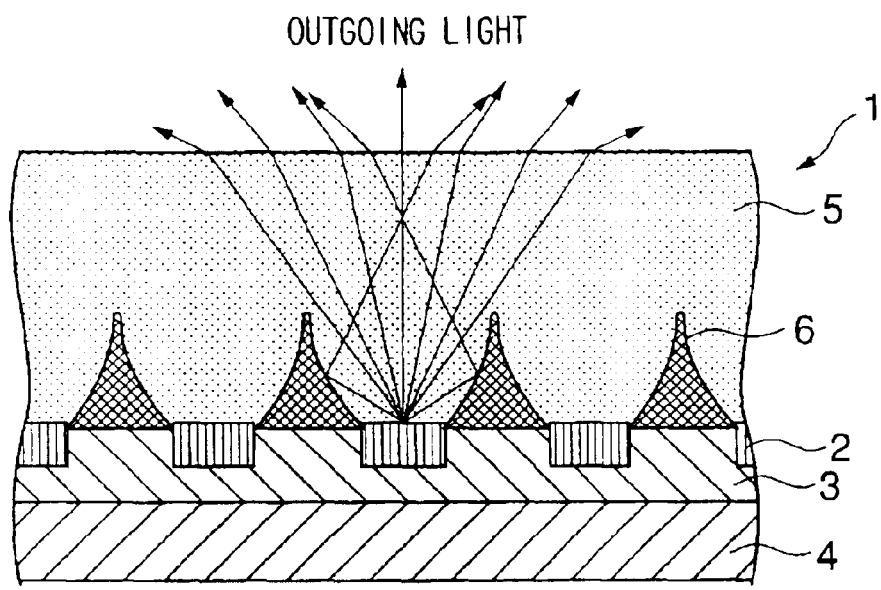
FIG. 3 is a cross-sectional view of another embodiment of the electroluminescent display according to the present invention.
Figure 4:
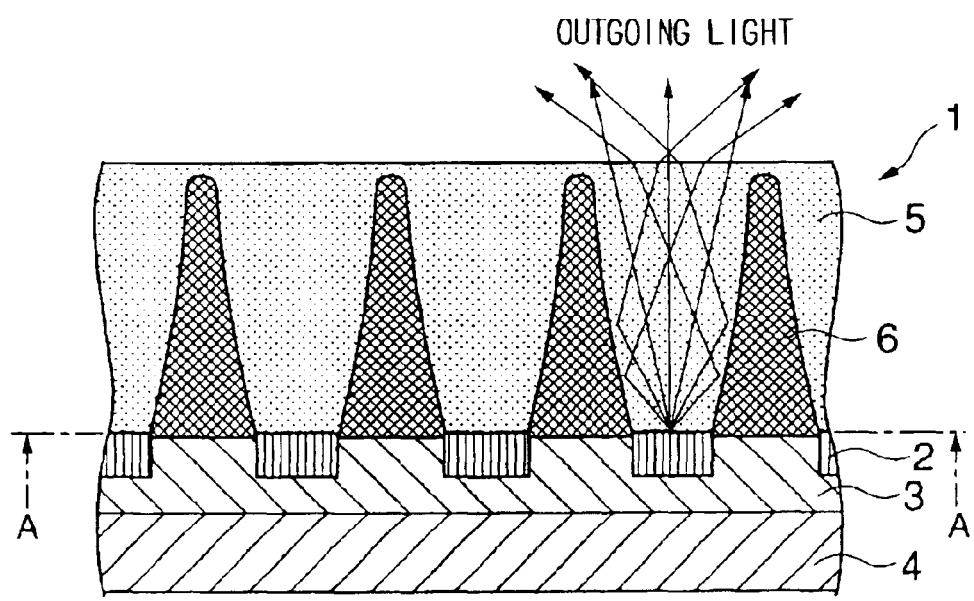
FIG. 4 is a cross-sectional view of a further embodiment of the electroluminescent display according to the present invention.

The present invention will be described in more detail with reference to the following preferred embodiments. Embodiments of the construction of the electroluminescent display according to the present invention will be described with reference to FIGS. 2 to 6. The construction of the electroluminescent display according to the present invention may be the same as that of the conventional electroluminescent display shown in FIG. 1, except that the construction of a light transparent substrate 1 is different from that of the conventional electroluminescent display. Specifically, as shown in FIGS. 2 to 4, in the electroluminescent display, an electroluminescent layer comprising at least a transparent electrode 2, a luminescent layer 3, and a cathode 4 is provided on the light transparent substrate 1. The characteristic feature of this electroluminescent display according to the present invention is that two regions with different refractive indexes, that is, a region 5 with a relatively higher refractive index and a region 6 with a relatively lower refractive index are provided within the substrate.

In the embodiment shown in FIG. 2, a higher refractive index region 5 and a lower refractive index region 6 are provided within a light transparent substrate 1. Both the higher refractive index region 5 and the lower refractive index region 6 have been patterned in the surface direction of the light transparent substrate 1. In this embodiment, as indicated by arrows in FIG. 2, light rays emitted, from the surface of a transparent anode 2, at an angle which causes total reflection from the light outgoing surface in the upper part in the drawing, are reflected from the interface between the higher refractive index region 5 and the lower refractive index region 6, and the reflected light rays reach the light outgoing surface and are observed as outgoing light by a viewer. Therefore, a significantly improved light take-out efficiency can be realized.

In the present invention, preferably, for example, the regions with different refractive indexes are two regions, one of which has a relatively higher refractive index and the other region has a relatively lower refractive index, and, in the substrate, the area ratio of the higher refractive index region to the whole region (sum of the higher refractive index region and the lower refractive index region) on the light outgoing surface side is higher than that on the electroluminescent layer side. This construction can improve the light take-out efficiency.

In FIG. 2, the area ratio on the light outgoing surface side of the substrate is a/(a+0) wherein a represents the area of the higher refractive index region 5 on the light outgoing surface side, and the area of the lower refractive index region 6 on the light outgoing surface side is 0 (zero). That is, 100% of the area of the light outgoing surface side of the substrate is accounted for by the higher refractive index region 5. On the other hand, the area ratio on the electroluminescent layer side of the substrate is c/(b+c) wherein c represents the area of the higher refractive index region 5 on the electroluminescent layer side and b represents the area of the lower refractive index region 6 on the electroluminescent layer side. That is, the area ratio of the higher refractive index region 5 is higher on the light outgoing surface side.

The surface of the boundary between the higher refractive index region 5 and the lower refractive index region 6 may be linear as shown in FIG. 2. For example, the lower refractive index region 6 may be in a cone, taper, or wedge form. As shown in FIGS. 3 and 4, preferably, as viewed in cross section of the substrate, the boundary line between the higher refractive index region and the lower refractive index region is partially or entirely concaved in a parabolic or elliptically arc form. According to this construction, as compared with the case where the above construction is not adopted, the proportion of light rays, which advance at such an angle that causes the confinement of the light rays within the light transparent substrate, can be lowered, contributing to improved light take-out efficiency.

When the form of the higher refractive index region 5 is such that the sectional area of the higher refractive index region 5 is changed in the thickness-wise direction as in this embodiment, a large part of light rays emitted from the electroluminescent layer is guided toward the viewer side while undergoing total reflection along the inner wall of the higher refractive index region 5. At that time, since the lower refractive index region 6 is in the above cone or other form, while undergoing total reflection, the light rays are subjected to a change in the direction of advance in a direction perpendicular to the substrate. Therefore, the proportion of light rays, which are totally reflected at the interface between the air layer and the higher refractive index region 5 on the viewer side, can be reduced, and a larger proportion of light rays can be taken out to the air.

In this case, the change in sectional area of the lower refractive index region 6, for example, in a cone form is not limited to the linear change. For example, the form of the lower refractive index region 6 may be such that the skirt of the lower refractive index region 6 on the electroluminescent layer side is narrowed so that light rays emitted from the electroluminescent layer strike against the light outgoing surface at a larger angle than the critical angle of the total reflection caused by the difference in refractive index between the substrate and the air. This construction can further increase the quantity of light which advances through the higher refractive index region 5 while undergoing total reflection from the lower refractive index region 6.

Publication No. 509327/1995 of the Japanese Translation of International Patent Application discloses the adoption of a conical region in a display. Unlike the electroluminescent display according to the present invention, however, the display disclosed in this publication adopts the conical region for widening the visual field of display light from a liquid crystal display illuminated mainly with highly parallel special backlight.

In the present invention, light emitted from the electroluminescent layer is guided through the higher refractive index region 5 toward the surface of the substrate 1 while undergoing a change in the direction of advance to a direction perpendicular to the surface of the substrate 1. On the other hand, external light is guided through the higher refractive index region 5 while undergoing a change in the direction of advance to a direction parallel to the surface. Therefore, on the electroluminescent layer side, the angle of advance of a large part of the external light exceeds the critical angle of the total reflection, and the external light is passed into the lower refractive index region 6. When a light absorbing layer is provided in the lower refractive index region 6, the external light rays are mostly absorbed in the light absorbing layer.

Preferably, the position of the pattern of the electroluminescent layer (pattern of the transparent anode 2 shown in FIGS. 2 to 6) is coincident with the position of the pattern of the higher refractive index region 5 in its portion which constitutes the boundary between the higher refractive index region 5 and the electroluminescent layer and thus is in contact with the electroluminescent layer. According to this construction, light emitted from the electroluminescent layer is propagated through the higher refractive index region and is taken out to the viewer side.

Figure 5:
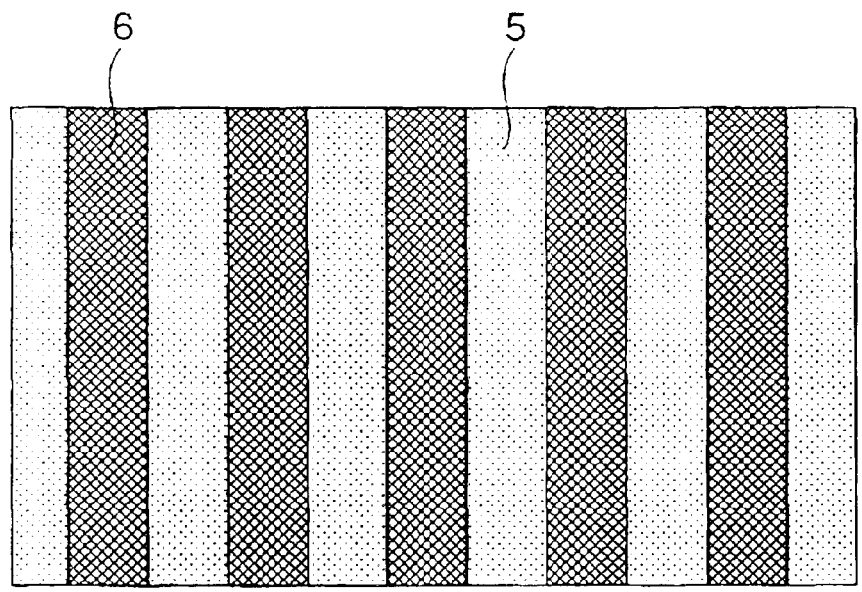
FIG. 5 is an explanatory view of one embodiment of the arrangement of a higher refractive index region and a lower refractive index region according to the present invention.
Figure 6:
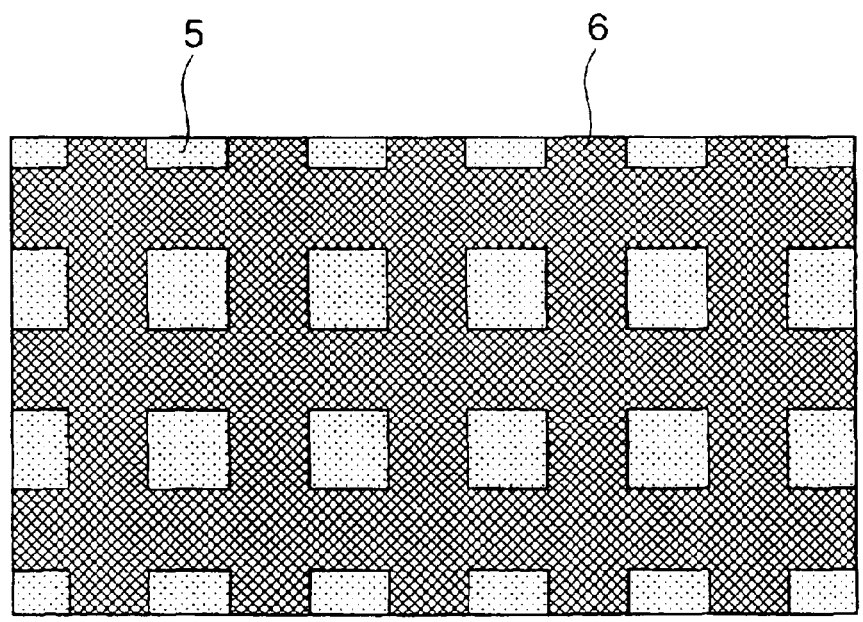
FIG. 6 is an explanatory view of another embodiment of the arrangement of a higher refractive index region and a lower refractive index region according to the present invention.

The arrangement of the higher refractive index region 5 and the lower refractive index region 6 in FIGS. 2 to 4 may be as shown in FIG. 5, which is a cross-sectional view taken on line A—A of FIG. 4, that is, shows the substrate on its electroluminescent layer side, and FIG. 6 which likewise shows the substrate on its electroluminescent layer side. That is, as shown in FIGS. 5 and 6, higher refractive index regions 5 and lower refractive index regions 6 are alternately arranged in the direction of the surface of the substrate. The arrangement may be in a one-dimensional form (stripe form) as shown in FIG. 5 or alternatively may be a two-dimensional form (dot matrix form) as shown in FIG. 6. In this case, in the thickness-wise direction of the substrate, the sectional area of the higher refractive index region on its electroluminescent layer side may be smaller than that of the higher refractive index region on its light outgoing surface (viewer) side. The design of the pitch, size, and number of the higher refractive index regions 5 in the direction of the surface of the substrate may vary depending upon the opening pattern of the electroluminescent layer (pattern of the transparent anode 2). More specifically, the opening of the electroluminescent layer and the cross-section of the higher refractive index region on its electroluminescent layer side may be substantially identical to each other in its position and area. In FIGS. 5 and 6, the area ratio between the higher refractive index region 5 and the lower refractive index region 6 is preferably higher refractive index region 5: lower refractive index region 6=approximately 1:2 to 2:1.

The material for the higher refractive index region 5 of the light transparent substrate 1 in the present invention is not particularly limited. The material for the higher refractive index region 5 is preferably formed of a conventional transparent solid polymer material from the viewpoint of moldability. An example of the material is a polymer which has been produced by photopolymerization of polymethyl methacrylate, polycarbonate, polyester, polystyrene, or acrylic monomer and has a refractive index of about 1.45 to 1.65.

The thickness of the substrate formed of the above material is preferably about 0.5 to 1.1 mm. Voids corresponding to the lower refractive index region 6 are formed within the substrate 1, for example, by pressing a heating mold having convexes conforming to the shape of the lower refractive index region 6 in its lowermost part against the light transparent substrate 1. The voids are filled with at least one member selected from gas, a liquid and a solid to form a lower refractive index region 6. In some cases, voids as such may be used as the lower refractive index region 6. The voids may be filled with light absorbing particles. The filling of these materials can enhance the absorbance of external light. The voids may be filled with a getter material (mainly in a powder form) for adsorbing oxygen and water, such as barium oxide (BaO), either alone or in combination with the above light absorbing material. According to this construction, the prolongation of the service life of the electroluminescent device can be expected.

After the filling of the voids with the getter material or the like, a thin-film layer having a refractive index substantially equal to the higher refractive index region 5, which does not greatly influence the optical characteristics, may be formed on the electroluminescent layer side of the substrate 1, from the viewpoint of enhancing the smoothness of the higher refractive index region 5 and the lower refractive index region 6 to facilitate the practice of the subsequent step. For example, a very thin glass plate (for example, AF 45, thickness 50 μm, manufactured by Schott) may be applied with the aid of an optical adhesive (for example, NOA 61, manufactured by Norland Corp.). Thus, preferably, for example, the gas, such as nitrogen, or the light absorbing material, which has been filled into the lower refractive index region 6, is hermetically sealed to avoid adverse effect on the electroluminescent layer.

According to the above construction, the light take-out efficiency of the electroluminescent display of the present invention can be improved. Further, as shown in FIG. 2, as with the above embodiment, external light incident to the higher refractive index region 5 in the substrate 1 is reflected from or absorbed in the interface between the higher refractive index region 5 and the lower refractive index region 6. Therefore, excellent external light reflection preventive effect can be realized. Thus, according to the present invention, an electroluminescent display can be provided in which light take-out efficiency can be improved and, at the same time, the incidence of external light can be suppressed to significantly improve the contrast of the displayed image.

EXAMPLES

The following examples and comparative examples further illustrate the present invention.

Example 1

The present invention will be described in more detail with reference to FIG. 2. FIG. 2 is a partially enlarged cross-sectional view of an electroluminescent display in one embodiment of the present invention. An acrylic substrate (Sumipex, refractive index 1.49, manufactured by Sumitomo Chemical Co., Ltd.) was provided as a light transparent substrate. A photopolymerizable acrylic monomer was slit coated onto the acrylic substrate to a predetermined thickness. In this example, the total thickness of the substrate after curing was brought to 0.5 mm. Next, a lower refractive index region 6 (void part in this example) was provided as follows. A mold, which had been subjected to release treatment and can perform embossing, was pressed against the above substrate, and a predetermined quantity of ultraviolet light was applied from the acrylic substrate side. After the completion of curing, the mold was separated. Thus, a substrate with voids having a desired shape could be formed. In this case, the substrate was designed and prepared to have the following dimension.

Total thickness of substrate=0.5 mm

Pitch of concaves/convexes (a part corresponding to a in FIG. 2)=0.3 mm

Width of convex part (a part corresponding to c in FIG. 2)=0.15 mm

Taper angle of lower refractive index region (angle of interfacial boundary to normal of substrate)=8.5 degrees Pixel forming region=diagonally 4 in. (3:4)

Next, a light absorbing material (carbon black) and a getter material (BaO powder) were sealed into the voids. In this case, since carbon black is electrically conductive, in a dot matrix display, there is a fear of causing shortcircuiting of the inter-pixel electrode. In this example, shortcircuiting was prevented by sealing the above two types of powders, then adding an acrylic monomer dropwise to the inside of the voids, spin coating the acrylic monomer over the whole surface to form a thin film, and then applying ultraviolet light to the acrylic monomer for curing. The thin film layer formation has also the effect of facilitating the formation of an electroluminescent layer.

Subsequently, an electroluminescent layer was formed by the following method on the substrate in its region where the lower refractive index region was not formed. Specifically, at the outset, an ITO transparent electrode, which had been patterned in a pixel form, was sputtered on the substrate in its convex part through a passivation layer. For the formation of an organic electroluminescent device, a luminescent organic material $Alq_3$ [tris(8-hydroxyquinoline)aluminium] and a hole injection layer TPD [N,N'-diphenyl-N,N'-bis(3-methyl-phenyl)-1,1-diphenyl-4,4'-diamine]were stacked to constitute a luminescent layer. ITO was used as the transparent anode, and a Mg—Ag (magnesium-silver) alloy was used as a cathode. In this case, TPD was provided so as to come into contact with ITO.

More specifically, ITO was first formed to a thickness of 150 nm. Next, TPD, which had been purified in a satisfactorily preheated sublimation purification apparatus under high vacuum, was loaded in a tungsten board, and a 50 nm-thick TPD layer was formed by electric resistance heating. Thereafter, $Alq_3$, which had been subjected to sublimation purification, was loaded in a quartz board, and a 30 nm-thick $Alq_3$ layer was formed on the TPD layer by electric resistance heating. A Mg—Ag alloy (Mg:Ag=10:1) was vapor deposited to a thickness of 150 nm. Further, a 200 nm-thick silver layer was formed as a protective layer on the alloy layer by vapor deposition. Finally, the assembly was sealed with separately provided glass plate and UV curing seal material. Thus, a panel part of an organic electroluminescent display was prepared. A controller and a power supply circuit were connected to this panel part to complete an electroluminescent display according to the present invention.

Subsequently, the power supply circuit of the electroluminescent display was operated for lighting. The electroluminescent display was examined for an improvement in brightness with a brightness measuring device (BM-7, manufactured by Topcon Corp.). The results of the measurement have revealed that an about 20% improvement in light take-out efficiency in electroluminescence could be achieved over a display in which the same electroluminescent layer pattern as used above was formed on a conventional substrate with a single refractive index layer. The possible reason for this improvement in light take-out efficiency is as follows. When a conventional substrate is used, the angle of advance of electroluminescence radiated within the substrate exceeds the critical angle, 41.8 degrees to the vertical direction. As a result, the electroluminescence is totally reflected and thus cannot be taken out. On the other hand, in this example of the present invention, the lower refractive index region has a taper angle of 8.5 degrees. Therefore, the critical angle of the total reflection is increased by this taper angle, and, thus, the increased critical angle could increase the proportion of emitted light which can be taken out to the outside of the electroluminescent display without causing total reflection. In fact, in the above case, the light take-out efficiency improvement was limited to 20% probably due to the occurrence of boundary reflection at the interface between the substrate and the air on the viewer side. When the design is taken into consideration, an about 45% improvement in light take-out efficient can be theoretically expected. Therefore, the provision of an antireflection layer at the interface between the substrate and the air on the viewer side can realize a light take-out efficiency improvement close to the designed value.

On the other hand, the electroluminescent display was evaluated for a reduction in incidence of external light to the electroluminescent display. In order to examine a change in incident light intensity depending upon the incident angle, collimated light from a xenon light source was applied so as to be incident to the electroluminescent display while successively changing the incident angle. In this case, a brightness measuring device was installed in a regular reflection direction of the substrate for measurement of the brightness. In the measurement, a surface reflection component on light outgoing side face of the substrate was previously measured and was subtracted from the measured values. The results of the evaluation showed that a significant reduction in light could be provided for light rays falling within the range of an angle of not less than about 31 degrees in terms of angle of incident to the substrate. About 40% reduction in light could be provided in an integral value of full angle range of incident light as converted from the measured values, indicating that the contrast of the display image could be significantly improved.

Example 2

In Example 2 of the present invention, an electroluminescent display according to the present invention was prepared in the same manner as in Example 1, except that three colors, i.e., the green light emitting material $Alq_3$ used in Example 1 and, in addition, DPVBi (1,4-bis(2,2-diphonylivinyl)biphenyl) as a blue light emitting material and a mixture, composed of $Alq_3$ and 1.0% by weight of DCM (dicyanomethylenepyran derivative) added to $Alq_3$, as a red light emitting material were vapor deposited using a mask so as to be juxtaposed to one another to constitute subpixels, whereby a full-color display was prepared. The electroluminescent display thus prepared was measured in the same manner as in Example 1. As a result, also for the electroluminescent display using the three primary colors, R (red), G (green), and B (blue), in this example, the same effect as attained in Example 1 could be confirmed.

Example 3

In Example 3 of the present invention, the procedure of Examples 1 and 2 was repeated, except that high-molecular weight organic electroluminescent materials were used instead of the low-molecular weight organic electroluminescent materials used in Examples 1 and 2. The hole injection layer was formed by spin coating PEDOT (polythiophene: CH 8000, manufactured by Bayer) to a thickness of 80 nm and baking the coating at 160° C. The following high-molecular weight organic electroluminescent materials were dissolved in a solvent to prepare coating liquids. The coating liquids were deposited by ink jet recording on PEDOT so that the three colors were juxtaposed to one another to constitute subpixels, whereby a full-color display was prepared.

| (Composition of coating liquid for formation of organic electroluminescent layer) | |
|---|---|
| Polyvinylcarbazole | 70 pts.wt. |
| Oxadiazole compound | 30 pts.wt. |
| (*Fluorescent dye) coumarin 6 | 1 pt.wt. |
| (Solvent) monochlorobenzene | 4,900 pts.wt. |

*When the fluorescent dye was coumarin 6, green light with a peak wavelength of 501 nm was emitted; when the fluorescent dye was perylene, blue light with a peak wavelength of 460 to 470 nm was emitted; and when the fluorescent dye was DCM, red light with a peak wavelength of 570 nm was emitted.

In order to protect the organic electroluminescent material against water- and oxygen-derived deterioration, all steps from baking of PEDOT to sealing were carried out in a glove box in which the air had been replaced by nitrogen. For the electroluminescent display prepared in this example, as with the electroluminescent displays prepared in Examples 1 and 2, an improvement in light take-out efficiency and an improvement in contrast by the prevention of incidence of external light could be achieved. The improvement level was the same as that in Examples 1 and 2.

Example 4

In Example 4, with a view to further improving the take-out efficiency of radiated light rather than a reduction in incidence of external light, a substrate having the following construction was prepared and evaluated. The substrate was prepared in the same manner as in Example 1. The total thickness of the substrate, the pitch, the width of convex, and the specifications of the pixel forming region were the same as in Example 1, and what is different from Example 1 was the shape of the lower refractive index region.

As shown in FIG. 3, the shape of the taper was such that the sectional area was decreased on the electroluminescent layer side. In this example, a curve satisfying a requirement represented by the following formula was designed: $\theta 2 \geq \theta 1 - \sin^{-1}(n2/n1)$ wherein $\theta 2 \geq 0$. In the formula, $\theta 1$ represents the angle of light radiated from the electroluminescent layer to the direction of normal to the substrate; $\theta 2$ represents the taper angle at a point where, when $\theta 1$ has been increased, the light is applied to the interface between the lower refractive index region and the higher refractive index region; $n2$ represents the refractive index of the lower refractive index region; and $n1$ represents the refractive index of the higher refractive index region. The curve is as shown in FIG. 3.

When the angle of the radiated light to the normal direction at which the light is applied to the interface between the higher refractive index region and the lower refractive index region increases and, in this case, when the angle exceeds a certain critical angle, the interface is escaped from total reflection conditions and, consequently, the light is transmitted from the higher refractive index region into the lower refractive index region. On the other hand, when the sectional area of the higher refractive index region is changed to form a shape satisfying the above formula, radiated light rays at any angle can be brought to totally reflection light rays and can be guided to the light outgoing side. The electroluminescent layer was formed in the same manner as in Example 3.

The electroluminescent display thus prepared was measured for brightness. As a result, it was found that an about 70% improvement in brightness was achieved. In the above design, theoretically, by virtue of the adoption of the curve represented by the above formula, even at angles above the conventional total reflection angle, all light rays can be guided to the viewer side. In the above calculation, however, only light rays radiated from the center of the electroluminescent layer were traced, and, for radiated light rays from the other regions was somewhat lost by total reflection. Further, also for light rays bent to an angle at which the light rays can be taken out, in fact, boundary reflection at the interface between the substrate and the air on the viewer side causes some loss of light rays. Therefore, it is considered that the above factors limited the brightness improvement to 70%. As with Example 1, the formation of an antireflection layer can realize a further improvement in light take-out efficiency.

A variant of this example is shown in FIG. 4. In this variant, the thickness of the lower refractive index region is substantially equal to the thickness of the substrate. The curve shown in FIG. 4 is a parabolic curve in which the center of the electroluminescent layer constitutes a focal plane. According to this construction, radiated light rays in all directions can be reflected from this curve, and substantially all light rays are arrayed parallel to the direction of normal to the substrate. This provides such a light quantity distribution that the light quantity is further concentrated on the viewer side.

The present invention is not limited to the above examples, and various modifications and alterations are possible. For example, the preparation of the substrate is not limited to the method wherein a metallic mold is pressed against an acrylic monomer for embossing, and, for example, shape formation by photolithography or shape formation by sandblasting can be adopted. Further, for the material for the substrate, glass may be used instead of the acrylic material. In this case, shape formation by patterning using photolithography, by etching with fluoric acid or the like, or by sandblasting is also possible.

Further, for the formation of the additional thin-film layer on the electroluminescent layer formation side, for example, the application of a thin glass layer (for example, AF 45, thickness 50 µm, manufactured by Schott) through an adhesive layer may be used instead of the spin coating of the acrylic resin.

As described above, unlike the prior art method wherein a large part of light rays radiated from the electroluminescent layer are guided in the facial direction of the substrate resulting in significantly deteriorated light take-out efficiency, in the present invention, the take-out efficiency of electroluminescence can be significantly improved through the utilization of simple process and materials. At the same time, the present invention can reduce another problem of the prior art, that is, a problem of lowered contrast caused by the incidence of external light.

What is claimed is:

1. An electroluminescent display comprising: a light transparent substrate; and an electroluminescent layer provided on said light transparent substrate, said electroluminescent layer comprising at least a transparent electrode, an organic luminescent layer, and a cathode, wherein (1) two or more regions with different refractive indexes are provided within said light transparent substrate and (2), as viewed in cross section of the substrate, a boundary line between the higher refractive index region and the lower refractive index region is a tapered line satisfying a requirement represented by the formula $\theta 2 \geq \theta 1 - \sin^{-1}(n2/n1)$ wherein $\theta 2 \geq 0$, $\theta 1$ represents the angle of light radiated from the electroluminescent layer to a direction normal to the substrate; $\theta 2$ represents a taper angle at a point where, when $\theta 1$ has been increased, the light is applied to the interface between the lower refractive index region and the higher refractive index region; $n2$ represents the refractive index of the lower refractive index region; and $n1$ represents the refractive index of the higher refractive index region.

2. The electroluminescent display according to claim 1, wherein the regions with different refractive indexes have been patterned in the direction of the surface of the substrate.

3. The electroluminescent display according to claim 2, wherein the regions with different refractive indexes are two regions, one of which has a relatively higher refractive index and the other region has a relatively lower refractive index, and, in the substrate, the area ratio of the higher refractive index region to the whole region on the light outgoing surface side is higher than that on the electroluminescent layer side.

4. The electroluminescent display according to claim 3, wherein, as viewed in cross section of the substrate, the boundary line between the higher refractive index region and the lower refractive index region is not linear.

5. The electroluminescent display according to claim 3, wherein the electroluminescent layer in its luminescent sites correspond respectively to positions in tbe higher refractive index region on its side in contact with the electroluminescent layer in the substrate.

6. The electroluminescent display according to claim 5, wherein luminescence emitted from the electroluminescent layer is passed through the higher refractive index region and is radiated toward a viewer side.

7. The electroluminescent display according to claim 3, wherein the lower refractive index region is a region of gas.

8. The electrolumiflescent display according to claim 7, wherein the gas is nitrogen.

9. The electroluminescent display according to claim 3, wherein at least one member selected from the group consisting of light absorbing materials and getter materials, for adsorbing oxygen or water has been filled into the lower refractive index region.

* * * * *